(12) United States Patent
Goren et al.

(10) Patent No.: US 8,179,045 B2
(45) Date of Patent: May 15, 2012

(54) SLOW WAVE STRUCTURE HAVING OFFSET PROJECTIONS COMPRISED OF A METAL-DIELECTRIC COMPOSITE STACK

(75) Inventors: Yehuda G. Goren, Scotts Valley, CA (US); Philip M. Lally, Palo Alto, CA (US)

(73) Assignee: Teledyne Wireless, LLC, Mountain View, CA (US)

( * ) Notice: Subject to any disclaimer, the term of this patent is extended or adjusted under 35 U.S.C. 154(b) by 245 days.

(21) Appl. No.: 12/428,371

(22) Filed: Apr. 22, 2009

(65) Prior Publication Data

US 2009/0261925 A1    Oct. 22, 2009

Related U.S. Application Data

(60) Provisional application No. 61/047,048, filed on Apr. 22, 2008.

(51) Int. Cl.
*H01J 23/38* (2006.01)
*H01J 25/34* (2006.01)

(52) U.S. Cl. ......................................... 315/3.5; 315/39.3
(58) Field of Classification Search .................. 315/3.5, 315/39.3
See application file for complete search history.

(56) References Cited

U.S. PATENT DOCUMENTS

| 2,111,412 A | 3/1938 | Ungelenk |
| 2,493,606 A | 1/1950 | Waterton |
| 2,687,777 A * | 8/1954 | Warnecke et al. ............. 315/3.5 |
| 2,706,366 A | 4/1955 | Best |
| 2,718,622 A | 9/1955 | Harkless |
| 2,939,952 A | 6/1960 | Paul et al. |
| 2,950,389 A | 8/1960 | Paul et al. |
| 2,976,454 A * | 3/1961 | Birdsall et al. ............. 315/3.5 |

(Continued)

FOREIGN PATENT DOCUMENTS

CH    260999    8/1949

(Continued)

OTHER PUBLICATIONS

"400 MSPS 14-Bit, 1.8 V CMOS, Direct Digital Synthesizer", AD9954, Analog Devices, 2003, 34 pages.

(Continued)

*Primary Examiner* — Benny Lee
(74) *Attorney, Agent, or Firm* — K&L Gates LLP

(57) ABSTRACT

A traveling wave amplifier circuit to receive an RF wave and an electron sheet beam and to effect synchronized interaction therebetween. The circuit includes a wave guide having at least a first wall and a second wall opposite the first wall. The first wall and the second wall are connected to define an axis of propagation and a rectangular wave guide cross-section that is normal to the axis of propagation. The circuit further includes a plurality of first projections located on an interior surface of the first wall of the wave guide, the first projections being pitched in a direction of the axis of propagation. The circuit further includes a plurality of second projections located on an interior surface of the second wall of the wave guide, the second projections being pitched in a direction of the axis of propagation. A number of the second projections are located on the interior surface of the second wall in a staggered configuration in a direction of the axis of propagation relative to a number of corresponding first projections located on the interior surface of the first wall.

23 Claims, 12 Drawing Sheets

U.S. PATENT DOCUMENTS

| | | | |
|---|---|---|---|
| 3,065,640 A | 11/1962 | Langmuir et al. | |
| 3,119,969 A | 1/1964 | Ducot et al. | |
| 3,243,735 A * | 3/1966 | Gross | 333/157 |
| 3,260,875 A | 7/1966 | Evans | |
| 3,300,677 A | 1/1967 | Karol et al. | |
| 3,310,864 A | 3/1967 | MacKerrow | |
| 3,334,225 A | 8/1967 | Langmuir | |
| 3,387,169 A * | 6/1968 | Farney | 315/3.5 |
| 3,423,638 A | 1/1969 | Dix et al. | |
| 3,453,711 A | 7/1969 | Miller | |
| 3,541,467 A | 11/1970 | Seidel | |
| 3,546,511 A | 12/1970 | Shimula | |
| 3,564,124 A | 2/1971 | Popovich | |
| 3,612,880 A | 10/1971 | Lansiart | |
| 3,617,740 A | 11/1971 | Skillicom | |
| 3,624,678 A | 11/1971 | Falce | |
| 3,688,222 A | 8/1972 | Lieberman | |
| 3,696,324 A | 10/1972 | Baum | |
| 3,716,745 A | 2/1973 | Phillips | |
| 3,748,729 A | 7/1973 | Bottcher et al. | |
| 3,753,140 A | 8/1973 | Feistel | |
| 3,755,717 A | 8/1973 | Shaw | |
| 3,780,334 A | 12/1973 | Leboutet | |
| 3,796,965 A | 3/1974 | Quesinberry et al. | |
| 3,873,889 A | 3/1975 | Leyba | |
| 3,886,470 A | 5/1975 | O'Neil et al. | |
| 3,893,048 A | 7/1975 | Lieberman | |
| 3,900,823 A | 8/1975 | Sokal et al. | |
| 3,946,341 A | 3/1976 | Chiron et al. | |
| 3,955,161 A | 5/1976 | MacTurk | |
| 3,956,712 A | 5/1976 | Hant | |
| 4,000,471 A | 12/1976 | Pankow | |
| 4,004,253 A | 1/1977 | Takesaki et al. | |
| 4,016,515 A | 4/1977 | Wauk, II | |
| 4,034,319 A | 7/1977 | Olsson | |
| 4,035,747 A | 7/1977 | Hindermayr et al. | |
| 4,037,182 A | 7/1977 | Burnett et al. | |
| 4,053,855 A | 10/1977 | Kivi et al. | |
| 4,059,815 A | 11/1977 | Makimoto et al. | |
| 4,061,944 A | 12/1977 | Gay | |
| 4,100,450 A | 7/1978 | Frutiger et al. | |
| 4,126,370 A | 11/1978 | Nijman | |
| 4,134,114 A | 1/1979 | Riggs et al. | |
| 4,165,472 A | 8/1979 | Wittry | |
| 4,184,123 A | 1/1980 | Grill et al. | |
| 4,197,540 A | 4/1980 | Riggs et al. | |
| 4,216,448 A | 8/1980 | Kasuga et al. | |
| 4,233,539 A | 11/1980 | Falce | |
| 4,258,328 A | 3/1981 | Prevot et al. | |
| 4,267,516 A | 5/1981 | Traa | |
| 4,270,069 A | 5/1981 | Wiehler | |
| 4,276,514 A | 6/1981 | Huang | |
| 4,278,957 A | 7/1981 | Starai et al. | |
| 4,292,610 A | 9/1981 | Makimoto et al. | |
| 4,304,978 A | 12/1981 | Saunders | |
| 4,309,677 A | 1/1982 | Goldman | |
| 4,359,666 A | 11/1982 | Tomoe | |
| 4,374,394 A | 2/1983 | Camisa | |
| 4,376,927 A | 3/1983 | McGalliard | |
| 4,379,741 A | 4/1983 | Sano et al. | |
| 4,382,238 A | 5/1983 | Makimoto et al. | |
| 4,406,770 A | 9/1983 | Chan et al. | |
| 4,412,272 A | 10/1983 | Wedertz et al. | |
| 4,431,977 A | 2/1984 | Sokola et al. | |
| 4,446,445 A | 5/1984 | Apel | |
| 4,455,504 A | 6/1984 | Iversen | |
| 4,488,128 A | 12/1984 | Odozynski | |
| 4,495,640 A | 1/1985 | Frey | |
| 4,506,241 A | 3/1985 | Makimoto et al. | |
| 4,510,551 A | 4/1985 | Brainard, II | |
| 4,532,478 A | 7/1985 | Silagi | |
| 4,540,884 A | 9/1985 | Stafford et al. | |
| 4,540,954 A | 9/1985 | Apel | |
| 4,554,514 A | 11/1985 | Whartenby et al. | |
| 4,560,829 A | 12/1985 | Reed et al. | |
| 4,577,340 A | 3/1986 | Carlson et al. | |
| 4,581,595 A | 4/1986 | Silagi | |
| 4,583,049 A | 4/1986 | Powell | |
| 4,584,699 A | 4/1986 | LaFiandra et al. | |
| 4,595,882 A | 6/1986 | Silagi et al. | |
| 4,600,892 A | 7/1986 | Wagner et al. | |
| 4,622,687 A | 11/1986 | Whitaker et al. | |
| 4,625,533 A | 12/1986 | Okada et al. | |
| 4,629,996 A | 12/1986 | Watanabe et al. | |
| 4,631,506 A | 12/1986 | Makimoto et al. | |
| 4,664,769 A | 5/1987 | Cuomo et al. | |
| 4,688,239 A | 8/1987 | Schaffner et al. | |
| 4,701,717 A | 10/1987 | Radermacher et al. | |
| 4,727,641 A | 3/1988 | Kanatani et al. | |
| 4,728,846 A | 3/1988 | Yasuda | |
| 4,730,173 A | 3/1988 | Tsunoda | |
| 4,733,208 A | 3/1988 | Ishikawa et al. | |
| 4,736,101 A | 4/1988 | Syka et al. | |
| 4,739,448 A | 4/1988 | Rowe et al. | |
| 4,740,765 A | 4/1988 | Ishikawa et al. | |
| 4,749,860 A | 6/1988 | Kelley et al. | |
| 4,761,545 A | 8/1988 | Marshall et al. | |
| 4,771,172 A | 9/1988 | Weber-Grabau et al. | |
| 4,779,056 A | 10/1988 | Moore et al. | |
| 4,788,705 A | 11/1988 | Anderson | |
| 4,792,879 A | 12/1988 | Bauknecht et al. | |
| 4,818,869 A | 4/1989 | Weber-Grabau | |
| 4,828,022 A | 5/1989 | Koehler et al. | |
| 4,841,179 A | 6/1989 | Hagino et al. | |
| 4,882,484 A | 11/1989 | Franzen et al. | |
| 4,885,551 A | 12/1989 | Myer | |
| 4,890,077 A | 12/1989 | Sun | |
| 4,891,615 A | 1/1990 | Komazaki et al. | |
| 4,899,354 A | 2/1990 | Reinhold | |
| 4,907,065 A | 3/1990 | Sahakian | |
| 4,928,206 A | 5/1990 | Porter et al. | |
| 4,928,296 A | 5/1990 | Kadambi | |
| 4,959,705 A | 9/1990 | Lemnios et al. | |
| 4,967,169 A | 10/1990 | Sun et al. | |
| 4,967,260 A | 10/1990 | Butt | |
| 4,974,057 A | 11/1990 | Tazima | |
| 4,975,577 A | 12/1990 | Franzen et al. | |
| 4,982,088 A | 1/1991 | Weitekamp et al. | |
| 4,985,690 A | 1/1991 | Eguchi et al. | |
| 4,988,392 A | 1/1991 | Nicholson et al. | |
| 4,990,948 A | 2/1991 | Sasaki et al. | |
| 5,021,743 A | 6/1991 | Chu et al. | |
| 5,030,933 A | 7/1991 | Ikeda | |
| 5,045,971 A | 9/1991 | Ono et al. | |
| 5,055,966 A | 10/1991 | Smith et al. | |
| 5,056,127 A | 10/1991 | Iversen et al. | |
| 5,065,110 A | 11/1991 | Ludvik et al. | |
| 5,065,123 A | 11/1991 | Heckaman et al. | |
| 5,075,547 A | 12/1991 | Johnson et al. | |
| 5,097,318 A | 3/1992 | Tanaka et al. | |
| 5,126,633 A | 6/1992 | Avnery et al. | |
| 5,128,542 A | 7/1992 | Yates et al. | |
| 5,134,286 A | 7/1992 | Kelley | |
| 5,144,268 A | 9/1992 | Weidman | |
| 5,148,117 A | 9/1992 | Talwar | |
| 5,166,649 A | 11/1992 | Aizawa et al. | |
| 5,170,054 A | 12/1992 | Franzen | |
| 5,173,672 A | 12/1992 | Heine | |
| 5,173,931 A | 12/1992 | Pond | |
| 5,182,451 A | 1/1993 | Schwartz et al. | |
| 5,182,524 A | 1/1993 | Hopkins | |
| 5,196,699 A | 3/1993 | Kelley | |
| 5,198,665 A | 3/1993 | Wells | |
| 5,200,613 A | 4/1993 | Kelley | |
| 5,250,916 A | 10/1993 | Zakman | |
| 5,274,233 A | 12/1993 | Kelley | |
| 5,285,063 A | 2/1994 | Schwartz et al. | |
| 5,291,062 A | 3/1994 | Higgins, III | |
| 5,291,158 A | 3/1994 | Blair et al. | |
| 5,295,175 A | 3/1994 | Pond | |
| 5,300,791 A | 4/1994 | Chen et al. | |
| 5,302,826 A | 4/1994 | Wells | |
| 5,311,059 A | 5/1994 | Banerji et al. | |
| 5,311,402 A | 5/1994 | Kobayashi et al. | |
| 5,319,211 A | 6/1994 | Matthews et al. | |
| 5,329,687 A | 7/1994 | Scott et al. | |
| 5,334,295 A | 8/1994 | Gallagher et al. | |

| | | | | | | |
|---|---|---|---|---|---|---|
| 5,336,390 | A | 8/1994 | Busack et al. | 5,962,995 A | 10/1999 | Avnery |
| 5,355,283 | A | 10/1994 | Marrs et al. | 5,982,233 A | 11/1999 | Hellmark et al. |
| 5,372,696 | A | 12/1994 | Kiesele et al. | 5,986,506 A | 11/1999 | Oga |
| 5,378,898 | A | 1/1995 | Schonberg et al. | 5,990,735 A | 11/1999 | Sigmon et al. |
| 5,389,903 | A | 2/1995 | Piirainen | 5,990,757 A | 11/1999 | Tonomura et al. |
| 5,395,507 | A | 3/1995 | Aston et al. | 5,990,763 A | 11/1999 | Sipilä |
| 5,404,273 | A | 4/1995 | Akagawa | 5,998,817 A | 12/1999 | Wen et al. |
| 5,438,686 | A | 8/1995 | Gehri et al. | 5,998,862 A | 12/1999 | Yamanaka |
| 5,457,269 | A | 10/1995 | Schonberg et al. | 5,998,877 A | 12/1999 | Ohuchi |
| 5,468,159 | A | 11/1995 | Brodsky et al. | 6,008,534 A | 12/1999 | Fulcher |
| 5,477,081 | A | 12/1995 | Nagayoshi | 6,020,629 A | 2/2000 | Farnworth et al. |
| 5,483,074 | A | 1/1996 | True | 6,024,618 A | 2/2000 | Makishima et al. |
| 5,493,074 | A | 2/1996 | Murata et al. | 6,069,027 A | 5/2000 | Mertol et al. |
| 5,495,215 | A | 2/1996 | Newell et al. | 6,087,716 A | 7/2000 | Ikeda |
| 5,498,487 | A | 3/1996 | Ruka et al. | 6,099,708 A | 8/2000 | Mallory et al. |
| 5,500,621 | A | 3/1996 | Katz et al. | 6,124,636 A | 9/2000 | Kusamitsu |
| 5,523,577 | A | 6/1996 | Schonberg et al. | 6,137,168 A | 10/2000 | Kirkman |
| 5,528,203 | A | 6/1996 | Mohwinkel et al. | 6,140,710 A | 10/2000 | Greenberg |
| 5,529,959 | A | 6/1996 | Yamanaka | 6,157,080 A | 12/2000 | Tamaki et al. |
| 5,541,975 | A | 7/1996 | Anderson et al. | 6,157,085 A | 12/2000 | Terashima |
| 5,557,163 | A | 9/1996 | Wakalopulos | 6,169,323 B1 | 1/2001 | Sakamoto |
| 5,561,085 | A | 10/1996 | Gorowitz et al. | 6,177,836 B1 | 1/2001 | Young et al. |
| 5,576,660 | A | 11/1996 | Pouysegur et al. | 6,225,696 B1 | 5/2001 | Hathaway et al. |
| 5,576,673 | A | 11/1996 | Asija | 6,255,767 B1 | 7/2001 | Lee et al. |
| 5,578,869 | A | 11/1996 | Hoffman et al. | 6,274,927 B1 | 8/2001 | Glenn |
| 5,598,034 | A | 1/1997 | Wakefield | 6,285,254 B1 | 9/2001 | Chen et al. |
| 5,608,331 | A | 3/1997 | Newberg et al. | 6,305,214 B1 | 10/2001 | Schattke et al. |
| 5,612,257 | A | 3/1997 | Tsemg et al. | 6,320,543 B1 | 11/2001 | Ohata et al. |
| 5,612,588 | A | 3/1997 | Wakalopulos | 6,353,257 B1 | 3/2002 | Huang |
| 5,614,442 | A | 3/1997 | Tsemg | 6,358,773 B1 | 3/2002 | Lin et al. |
| 5,621,270 | A | 4/1997 | Allen | 6,359,476 B2 | 3/2002 | Hartman et al. |
| 5,623,123 | A | 4/1997 | Umehars | 6,400,415 B1 | 6/2002 | Danielsons |
| 5,627,871 | A | 5/1997 | Wang | 6,404,291 B1 | 6/2002 | Riley |
| 5,635,762 | A | 6/1997 | Gamand | 6,407,492 B1 | 6/2002 | Avnery et al. |
| 5,644,169 | A | 7/1997 | Chun | 6,414,849 B1 | 7/2002 | Chiu |
| 5,668,512 | A | 9/1997 | Mohwinkel et al. | 6,441,692 B1 | 8/2002 | Nakatani et al. |
| 5,675,288 | A | 10/1997 | Peyrotte et al. | 6,443,632 B2 | 9/2002 | Ando et al. |
| 5,682,412 | A | 10/1997 | Skillicorn et al. | 6,459,337 B1 | 10/2002 | Goren et al. |
| 5,696,473 | A | 12/1997 | Tsujiguchi et al. | 6,462,413 B1 | 10/2002 | Polese et al. |
| 5,705,959 | A | 1/1998 | O'Loughlin | 6,507,110 B1 | 1/2003 | Chen et al. |
| 5,708,283 | A | 1/1998 | Wen et al. | 6,515,525 B2 | 2/2003 | Hasegawa |
| 5,719,539 | A | 2/1998 | Ishizaki et al. | 6,545,398 B1 | 4/2003 | Avnery |
| 5,723,904 | A | 3/1998 | Shiga | 6,549,765 B2 | 4/2003 | Welland et al. |
| 5,728,289 | A | 3/1998 | Kirchnavy et al. | 6,553,089 B2 | 4/2003 | Huh et al. |
| 5,736,783 | A | 4/1998 | Wein et al. | 6,566,748 B1 | 5/2003 | Shimizu et al. |
| 5,737,387 | A | 4/1998 | Smither | 6,570,452 B2 | 5/2003 | Sridharan |
| 5,742,002 | A | 4/1998 | Arredondo et al. | 6,590,450 B2 | 7/2003 | Chen et al. |
| 5,742,201 | A | 4/1998 | Eisenberg et al. | 6,593,783 B2 | 7/2003 | Ichimaru |
| 5,742,204 | A | 4/1998 | Bell | 6,597,250 B2 | 7/2003 | Jovenin |
| 5,742,214 | A | 4/1998 | Toda et al. | 6,600,378 B1 | 7/2003 | Patana |
| 5,748,058 | A | 5/1998 | Scott | 6,603,360 B2 | 8/2003 | Kim et al. |
| 5,749,638 | A | 5/1998 | Cornelissen et al. | 6,608,529 B2 | 8/2003 | Franca-Neto |
| 5,753,857 | A | 5/1998 | Choi | 6,622,010 B1 | 9/2003 | Ichimaru |
| 5,760,646 | A | 6/1998 | Belcher et al. | 6,630,774 B2 | 10/2003 | Avnery |
| 5,760,650 | A | 6/1998 | Faulkner et al. | 6,674,229 B2 | 1/2004 | Avnery et al. |
| 5,761,317 | A | 6/1998 | Pritchard | 6,714,113 B1 | 3/2004 | Abadeer et al. |
| 5,783,900 | A | 7/1998 | Humphries, Jr. et al. | 6,731,015 B2 | 5/2004 | Wu et al. |
| 5,789,852 | A | 8/1998 | Cornelissen et al. | 6,750,461 B2 | 6/2004 | Fink et al. |
| 5,796,211 | A | 8/1998 | Graebner et al. | 7,026,749 B2 | 4/2006 | Rho et al. |
| 5,818,692 | A | 10/1998 | Denney, Jr. et al. | 2002/0030269 A1 | 3/2002 | Ammar |
| 5,825,195 | A | 10/1998 | Hembree et al. | 2002/0093379 A1 | 7/2002 | Goren et al. |
| 5,830,337 | A | 11/1998 | Xu | 2003/0021377 A1 | 1/2003 | Turner et al. |
| 5,832,598 | A | 11/1998 | Greenman et al. | 2003/0058961 A1 | 3/2003 | Fling et al. |
| 5,835,355 | A | 11/1998 | Dordi | 2003/0132529 A1 | 7/2003 | Yeo et al. |
| 5,838,195 | A | 11/1998 | Szmurto et al. | 2003/0151133 A1 | 8/2003 | Kinayman et al. |
| 5,847,453 | A | 12/1998 | Uematsu et al. | 2004/0223575 A1 | 11/2004 | Meltzer et al. |
| 5,861,777 | A | 1/1999 | Sigmon et al. | 2005/0077973 A1 | 4/2005 | Dayton, Jr. |
| 5,877,560 | A | 3/1999 | Wen et al. | 2009/0096378 A1* | 4/2009 | Barnett et al. .................. 315/3.5 |
| 5,886,248 | A | 3/1999 | Paulus et al. | | | |
| 5,903,239 | A | 5/1999 | Takahashi et al. | FOREIGN PATENT DOCUMENTS | | |
| 5,909,032 | A | 6/1999 | Wakalopulos | DE | 965048 | 5/1957 |
| 5,910,753 | A | 6/1999 | Bogdan | DE | 2653856 | 2/1978 |
| 5,915,213 | A | 6/1999 | Iwatsuki et al. | DE | 3438382 A1 | 4/1986 |
| 5,930,688 | A | 7/1999 | Floyd et al. | DE | 4111703 C2 | 11/1991 |
| 5,932,926 | A | 8/1999 | Maruyama et al. | EP | 0148706 | 7/1985 |
| 5,940,025 | A | 8/1999 | Koehnke et al. | EP | 0180328 | 5/1986 |
| 5,942,092 | A | 8/1999 | Weyl et al. | EP | 0205399 A2 | 12/1986 |
| 5,945,734 | A | 8/1999 | McKay | EP | 0293791 A1 | 7/1988 |
| 5,949,140 | A | 9/1999 | Nishi et al. | EP | 0331289 | 9/1989 |

| | | |
|---|---|---|
| EP | 0336990 | 10/1989 |
| EP | 0350159 A | 1/1990 |
| EP | 0 377 519 | 7/1990 |
| EP | 0383961 | 8/1990 |
| EP | 0 393 584 A2 | 10/1990 |
| EP | 0411180 | 2/1991 |
| EP | 491161 | 6/1992 |
| EP | 0524011 | 1/1993 |
| EP | 0617465 A1 | 9/1994 |
| EP | 0639747 A1 | 2/1995 |
| EP | 0641035 A2 | 3/1995 |
| EP | 0786660 A2 | 7/1997 |
| GB | 760555 | 10/1956 |
| GB | 984607 | 2/1965 |
| GB | 1302605 | 1/1973 |
| GB | 1507458 | 4/1978 |
| GB | 1519456 | 7/1978 |
| GB | 2018171 | 10/1979 |
| GB | 2143237 A | 2/1985 |
| GB | 2178540 A | 2/1987 |
| GB | 2271471 | 4/1994 |
| GB | 2326485 A | 12/1998 |
| JP | 56-107601 | 8/1981 |
| JP | 58-019001 | 2/1983 |
| JP | 58-178602 | 10/1983 |
| JP | 173903 | 7/1989 |
| JP | 01173777 | 7/1989 |
| JP | 283074 | 11/1989 |
| JP | 02226801 | 9/1990 |
| JP | 403048448 | 3/1991 |
| JP | 03187247 | 8/1991 |
| JP | 61 51946 | 5/1994 |
| JP | 61 99629 | 7/1994 |
| JP | 204705 | 7/1994 |
| JP | 08237007 | 9/1996 |
| WO | WO 82/03522 | 10/1982 |
| WO | WO 83/02850 | 8/1983 |
| WO | WO 93/01625 | 1/1993 |
| WO | WO 93/24968 | 12/1993 |
| WO | WO 97/17738 | 5/1997 |
| WO | WO 97/17755 | 5/1997 |
| WO | WO 99/22229 | 5/1999 |
| WO | WO 00/07239 | 7/1999 |

OTHER PUBLICATIONS

"RF PLL Frequency Synthesizers", ADF4110-ADF4111-ADF4112-ADF4113, Analog Devices, 2003, 24 pages.
Burggraaf, "Chip scale and flip chip: Attractive Solutions", Solid State Technology, Jul. 1998, 5 pages.
Filtronic publication, Filtronic Components Limited, Sub Systems Division, West Yorkshire, England, 1994—2 pages.
K&L Microwave Incorporated, A Dover Technologies Company, Salisbury, England, 1988—2 pages.
Krems, et al., "Avoiding Cross Talk and Feed Back Effects in Packaging Coplanar Millimeter-Wave Circuits", WE4B-3, IEEE MTT-S Digest, 1998, pp. 1091-1094.
Lieberman et al., "1974 IEEE International Solid State Circuits Conference", pp. 100-101, 235.
M.A.R.Gunston, Microwave Transmission-Line Impedance Data, London, 1972, p. 52.
Makimoto et al., "Compact Bandpass Filters Using Stepped Impedance Resonators," Proceedings of the IEEE, vol. 67, No. 1, Jan. 1979, pp. 16-19.
Matthaei, et al., "Microwave Filters, Impedance Matching Networks and Coupling Structures", Dedham, MA, pp. 355-380.
Moore et al., "1980 Ultrasonic Symposium", pp. 838-841.
Muhonen et al., "Amplifier Linearization for the Local Multipoint Distribution System Application," IEEE Personal, Mobile, Indoor and Radio Communication Conference, Boston, MA, 6 pages, Sep. 1998.
Ohiso, et al., "Flip-Chip Bonded 0.85-μm Bottom-Emitting Vertical-Cavity Laser Array on an AlGaAs Substrate", IEEE Photonics Technology Letters, vol. 8, No. 9, Sep. 1996, pp. 1115-1117.
Okeans, et al., "Properties of a TEM Transmission Line Used in Microwave Integrated Circuit Applications", Transactions of the IEEE, MIT-15, May, 1967, pp. 327-328.
Peter, "Solder Flip-Chip and CSP Assembly System", Chip Scale Review, Jul./Aug. 1999, pp. 58-62.
Reeder et al., IEEE Transactions on Microwave Theory and Techniques, No. 11, Nov. 1969, pp. 927-941.
Sagawa et al., "Geometrical Structures and Fundamental Characteristics of Microwave Stepped Impedance Resonators," IEEE Transactions on Microwave Theory and Techniques, vol. 45, No. 7, Jul. 1997, pp. 1078-1085.
Sakai et al. "A Novel Millimeter-Wave IC on Si Substrate Using Flip-Chip Bonding Technology", IEICE Trans. Electron, vol. E78-C., No. 8, Aug. 1995, pp. 971-978.
Sundelin et al., "1979 Ultrasonic Symposium, IEEE", pp. 161-164.
Wadsworth, et al., "Flip Chip GaAs MMICs for Microwave MCM-D Applications", Advancing Microelectronics, May/Jun. 1998, pp. 22-25.
Wolf et al. "Silicon Processing for the VLSI era, vol. 1: Process Technology," Lattice Press, 2000, pp. 846-851, 863-865.
U.S. Appl. No. 60/979,392, filed Oct. 12, 2007, entitled Barnett-Shin Traveling-Wave Tube (TWT) Slow Wave Circuit for Millimeter.
Shin-Barnett, "Intense wideband terahertz amplification using phase shifted periodic electron-plasmon coupling", Applied Physics Letters 92, 2008, 091501-1 to 091501-3.
Chapter 2. "The Axial Mode Helix—A Historical Perspective", pp. 4-15.
Srivastava, "THz Vacuum Microelectronic Devices", Journal of Physics: Conference Series 114 (2008) 012015, 10 pages.
Carlsten et al., "Technology Development for a mm-Wave Sheet-Beam Traveling-Wave Tube", IEEE Transactions on Plasma Science, vol. 33, No. 1, Feb. 2005, pp. 85-93.
Krawczyk et al., "Design of a 300 GHZ Broadband TWT Coupler and RF-Structure", Proceedings of LINAC 2004, Lubeck, Germany, pp. 794-796.

* cited by examiner

SLOW WAVE STRUCTURE HAVING OFFSET PROJECTIONS COMPRISED OF A METAL-DIELECTRIC COMPOSITE STACK

CROSS REFERENCE TO RELATED APPLICATION

This application claims priority from U.S. Provisional patent application Ser. No. 61/047,048 filed Apr. 22, 2008, the disclosure of which is incorporated herein by reference.

TECHNICAL FIELD

This application is directed generally and in various embodiments to slow wave structures (SWS) and electron sheet beam-based amplifiers including same.

BACKGROUND

Amplifiers come in many forms and are used in many applications. For example, amplifiers may be used with digital or analog signals in communications systems such as, for example, wireless telecommunications and satellite communications systems. Generally, amplifiers are either semiconductor-based or vacuum tube-based. Because electrons can travel at a higher velocity in a vacuum than in a semiconductor, vacuum tube amplifiers may be fabricated from structures that are larger relative to those of semiconductor-based devices but that have comparable transit times. Larger structures permit greater power levels. Accordingly, vacuum tube microwave power amplifiers, such as traveling wave tube (TWT) amplifiers, are used as power amplifiers in modern microwave systems, including telecommunications, radar, electronic warfare, and navigation systems, due to their ability to provide microwave energy at power levels orders magnitude higher than those of semiconductor microwave amplifiers.

Conventional vacuum tube microwave power amplifiers that utilize cylindrical electron beam geometries may not be suitable for high frequency and high bandwidth applications. In particular, electron beam diameter in such devices may be scaled with radio-frequency (RF) wavelength, while electrical current may be scaled with RF power. Therefore, at higher frequency and power, current density may exceed the confinement capability of known magnetic materials, which, in turn, limits amplifier power and bandwidth.

One advantage of electron sheet beam-based amplifiers is that beam thickness and width are scaled differently with frequency, thereby enabling higher current with lower current density to be transported in a smaller sized tube. Conventional wide band slow wave structures (SWS) (e.g., a helix SWS) for amplifying RF waves are not suitable for electron sheet beam configurations.

SUMMARY OF THE INVENTION

In one general respect, this application discloses a traveling wave amplifier circuit to receive an RF wave and an electron sheet beam and to effect synchronized interaction therebetween. The circuit includes a wave guide having at least a first wall and a second wall opposite the first wall. The first wall and the second wall are connected to define an axis of propagation and a rectangular wave guide cross-section that is normal to the axis of propagation. The circuit further includes a plurality of first projections located on an interior surface of the first wall of the wave guide, the first projections being pitched in a direction of the axis of propagation. The circuit further includes a plurality of second projections located on an interior surface of the second wall of the wave guide, the second projections being pitched in a direction of the axis of propagation. A number of the second projections are located on the interior surface of the second wall in a staggered configuration in a direction of the axis of propagation relative to a number of corresponding first projections located on the interior surface of the first wall.

In another general respect, this application discloses an RF SWS to couple an RF wave to an electron sheet beam. The RF SWS includes a wave guide having at least a first wall and a second wall opposite the first wall. The first wall and the second wall are connected to define an axis of propagation and a rectangular wave guide cross-section that is normal to the axis of propagation. The RF SWS further includes at least one cell. The cell includes adjacent first portions of a pair of first projections, the pair of first projections being adjacently located on an interior surface of the first wall. Each of the first projections is normal to the interior surface of the first wall, and the first projections are axially spaced along the axis of propagation to define a gap. The cell further includes a second projection located on an interior surface of the second wall. The second projection is normal to the interior surface of the second wall and axially positioned along the axis of propagation such that the second projection is centrally located on a portion of the interior surface of the second wall opposite the gap.

In another general respect, this application discloses a device including an electron sheet beam source for generating an electron sheet beam, and an amplifier circuit coupled to the electron sheet beam source to receive the electron sheet beam and an RF wave to effect synchronized interaction therebetween. The circuit includes a wave guide having at least a first wall and a second wall opposite the first wall. The first wall and the second wall are connected to define an axis of propagation and a rectangular wave guide cross-section that is normal to the axis of propagation. The circuit further includes a plurality of first projections located on an interior surface of the first wall of the wave guide, the first projections being pitched in a direction of the axis of propagation. The circuit further includes a plurality of second projections located on an interior surface of the second wall of the wave guide, the second projections being pitched in a direction of the axis of propagation. A number of the second projections are located on the interior surface of the second wall in a staggered configuration in a direction of the axis of propagation relative to a number of corresponding first projections located on the interior surface of the first wall.

DETAILED DESCRIPTION OF THE INVENTION

Figure 1:
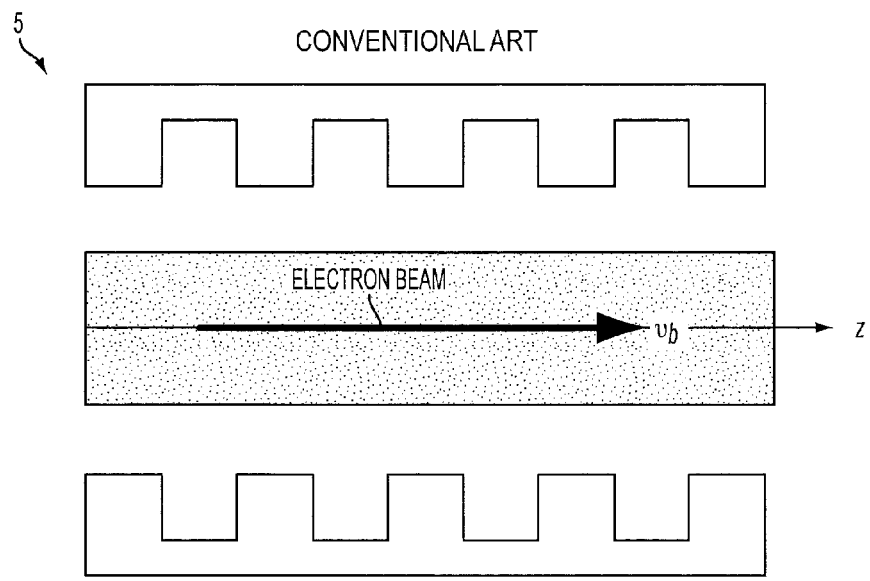
FIG. 1 illustrates a cross-sectional side view of a conventional art double metallic aligned vane SWS.
Figure 2:
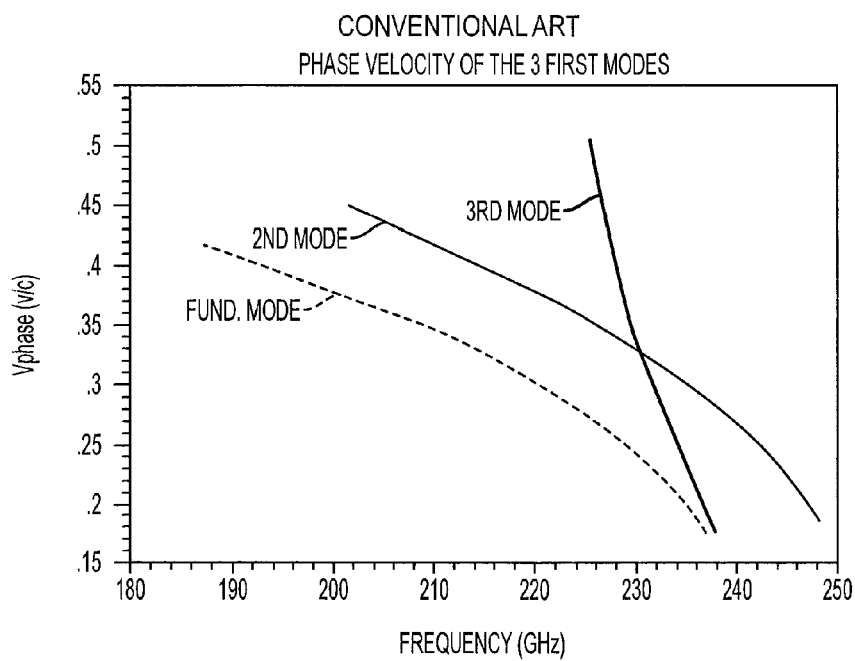
FIG. 2 illustrates a phase velocity vs. frequency characteristic of the first three modes of a conventional art typical Smith-Purcell structure.

FIG. 1 is a cross-section side view of a high frequency electron sheet beam SWS in the form of a double metallic aligned vane structure 5, also referred to in the art as a Smith-Purcell structure. FIG. 1 shows an electron beam traveling through a Smith-Purcell structure along an axis z. The electron beam travels through the Smith-Purcell structure at a velocity $v_b$. One drawback of the Smith-Purcell structure 5 is that its fundamental mode is a backward wave mode which may drive an amplifier using this structure into oscillations. Additionally, the axial electric field of the fundamental mode is anti-symmetric in the vertical direction, thus disrupting the electron sheet beam to an extent. Moreover, amplifiers using the Smith-Purcell structure 5 must operate at a relatively high voltage (i.e., high phase velocity) and at a relatively narrow bandwidth due to circuit dispersion. FIG. 2 illustrates a phase velocity $\{V_{Phase} (v/c)\}$ vs. frequency, in GHz, characteristic of the first three modes of a typical Smith-Purcell structure. The fundamental mode (n=0 spatial harmonic) and the second mode (n=1 spatial harmonic) correspond to backward amplifying modes. Only the third mode is the forward amplifying mode.

Figure 3A:
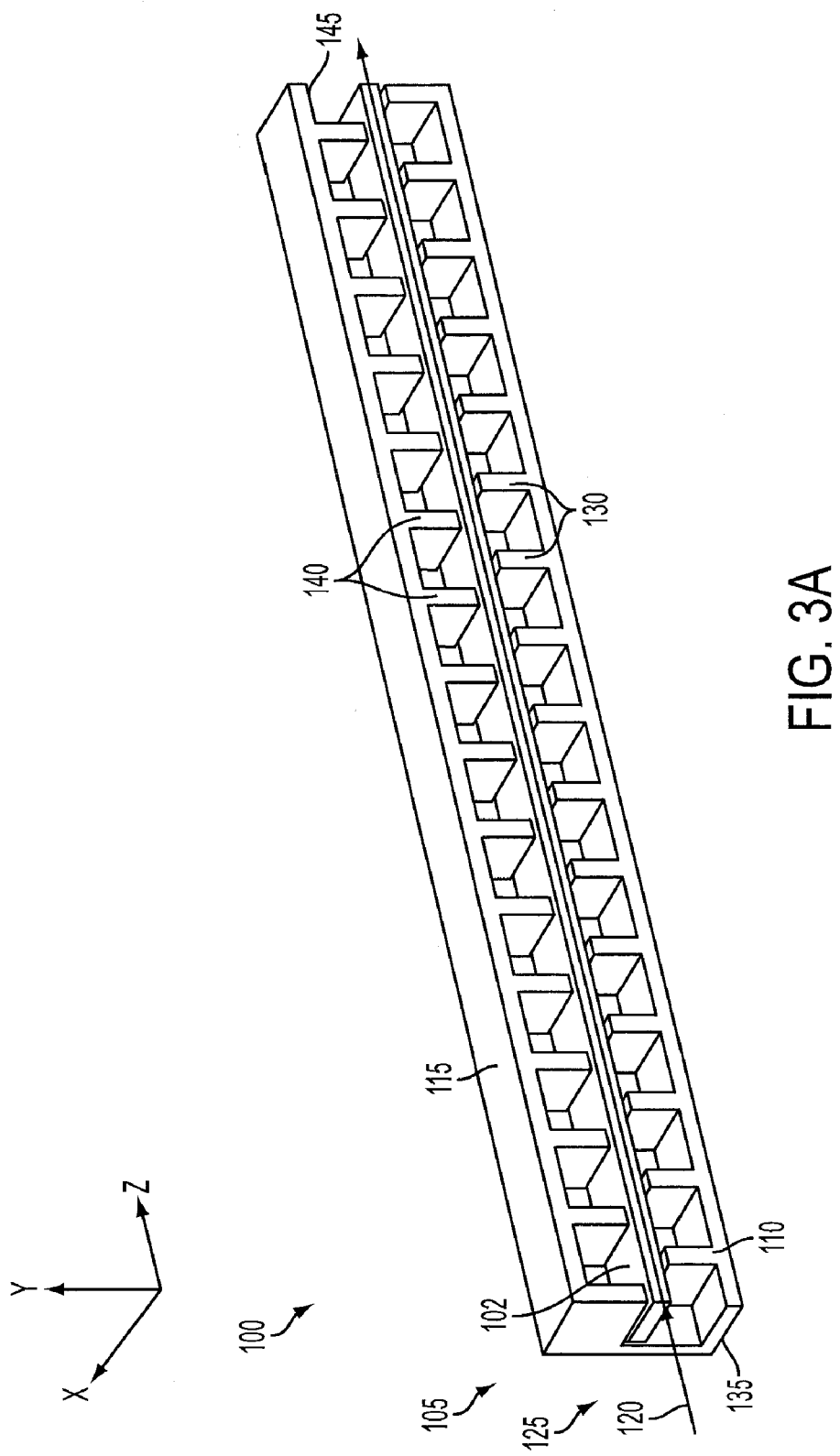
FIG. 3A illustrates a perspective cut-away side view of an electron sheet beam amplifier circuit according to one embodiment.
Figure 3B:
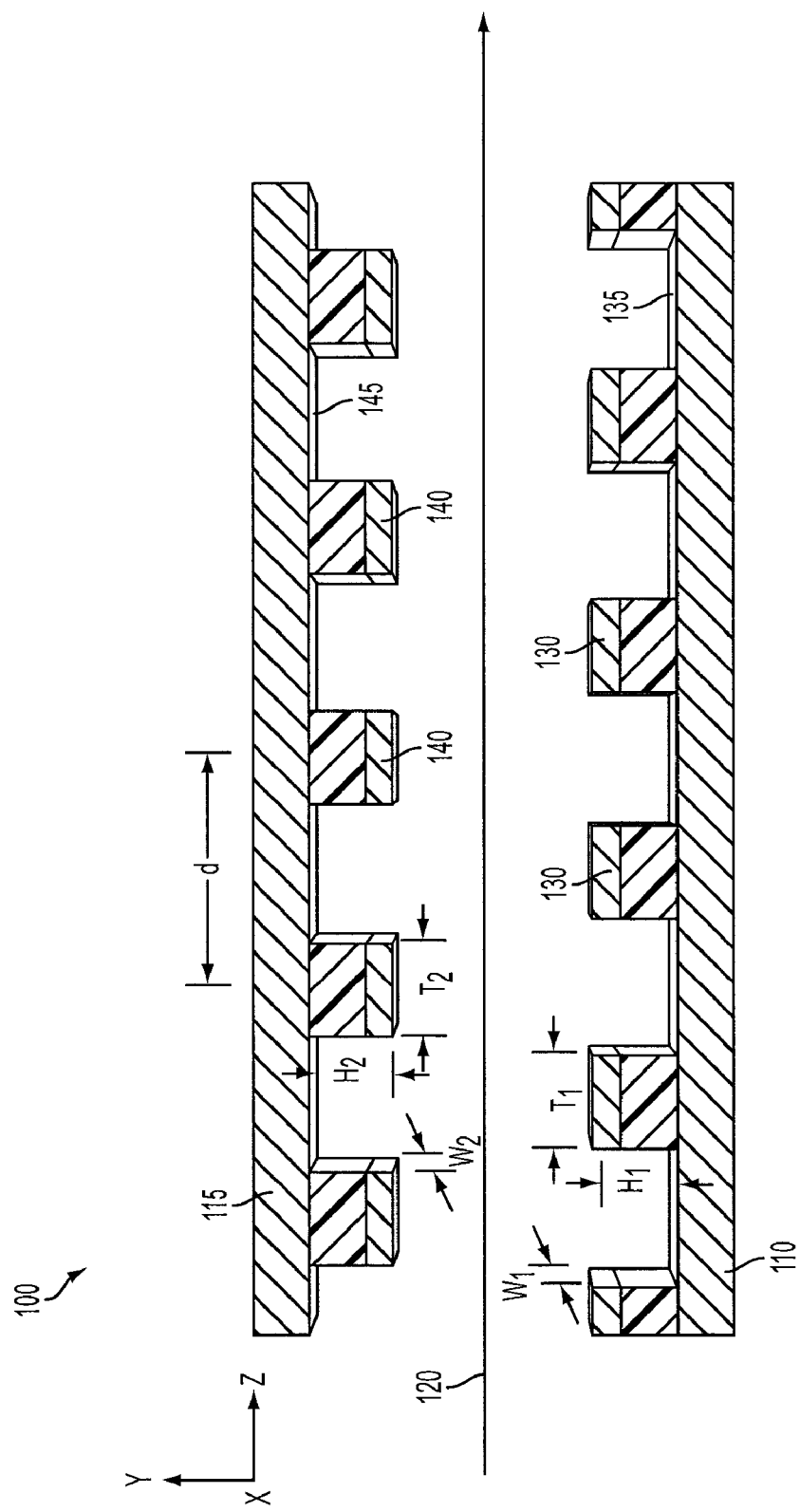
FIG. 3B illustrates a cross-sectional side view of a portion of the circuit of FIG. 3A.

FIG. 3A is a perspective cut-away side view of one embodiment of an electron sheet beam amplifier circuit, shown along axes X, Y, and Z. The circuit may comprise an SWS 100 for slowing the wave velocity of an input RF wave to match the wave velocity of an input electron sheet beam 102. The electron sheet beam may be generated using a suitable sheet beam electron gun, for example. Synchronous interaction between the velocity-matched RF wave and electron sheet beam affects a transfer of energy from the electron sheet beam to the RF wave, thus increasing the power of the input RF wave. FIG. 3B is a cross-sectional side view, shown along axes X, Y, and Z, of a portion of the SWS 100 of FIG. 3A. As will be appreciated from the discussion that follows, an advantage of the SWS 100 is that, unlike the Smith-Purcell structure 5 of FIG. 1, the fundamental mode of the SWS 100 is the amplifying traveling wave mode. Additionally, the SWS 100 is configurable to operate either as a compact narrowband high power and high gain amplifier (e.g., by virtue of a large interaction impedance between the SWS 100 and an electron sheet beam passed therethrough), or as a wide band high power amplifier with extended dimensions (e.g., by virtue of a smaller interaction impedance between the SWS 100 and an electron sheet beam passed therethrough). Various embodiments of the SWS 100 are described below in connection with a high gain terahertz SWS configuration and a wide band millimeter wave SWS configuration.

Referring to FIG. 3A, the SWS 100 may comprise a wave guide 105 comprising at least a first wall 110 and a second wall 115 opposite the first wall 110. The first and second walls 110, 115 may be electrically conductive and connected (e.g., by electrically conductive third and fourth walls) to define an axis of propagation 120 and a rectangular wave guide cross-section 125 that is normal to the axis of propagation 120. The SWS 100 may further comprise a plurality of first projections 130 located on an interior surface 135 of the first wall 110, with the first projections 130 being distributed at a first pitch, or first period, in a direction of the axis of propagation 120. The SWS 100 may further comprise a plurality of second projections 140 located on an interior surface 145 of the second wall 115 that is opposite the first wall 110, with the second projections 140 being distributed at a second pitch, or second period, in a direction of the axis of propagation 120. As shown, a number of the second projections 140 located on the interior surface 145 of the second wall 115 may be arranged in a staggered or alternating configuration in a direction of the axis of propagation 120 relative to a number of corresponding first projections 130 located on the interior surface 135 of the first wall 110. In other words, a portion of the second projections 140 are alternatingly positioned with respect to a portion of corresponding first projections 130 along the axis of propagation 120. Advantageously, the staggered configuration allows the fundamental mode of the SWS 100 to have a strong symmetric axial electric field distribution (e.g., in-phase field variation) along the axis of propagation 120. Accordingly, unlike the Smith-Purcell structure 5 of FIG. 1, the SWS 100 does not require the use of higher order symmetric modes that may be characterized by lower interaction impedance relative to the fundamental mode that may contribute to instability due to mode competition and overmoding.

In certain embodiments, and as shown in FIG. 3A, each of the first projections 130 may be in the form of a first vane 130 substantially perpendicularly oriented relative to the interior surface 135 of the first wall 110, and each of the second projections 140 may be in the form of a second vane 140 substantially perpendicularly oriented relative to the interior surface 145 of the second wall 115. As shown in FIG. 3B, each first vane 130 may define a substantially constant thickness $T_1$ measure in a direction of the axis of propagation 120, a substantially constant height $H_1$ measured in a direction normal to the interior surface 135 of the first wall 110, and a substantially constant width $W_1$ measure in a direction transverse to the axis of propagation 120. Similarly, each second vane 140 may define a substantially constant thickness $T_2$ measured in a direction of the axis of propagation 120, a substantially constant height $H_2$ measured in a direction normal to the interior surface 145 of the second wall 115, and a substantially constant width $W_2$ measured in a direction transverse to the axis of propagation 120. According to various embodiments, either or both widths $W_1$ and $W_2$ of the vanes 130, 140, respectively, may be less than or substantially equal to the width of their corresponding interior surfaces 135, 145 (e.g., the width of the SWS 100). In the embodiment of FIG. 3A, for example, widths of the vanes 130, 140 are substantially equal to the widths of their corresponding interior surfaces 135, 145. For such embodiments, side surfaces of the vanes 130, 140 may terminate on side surfaces of the wave guide, for example.

In certain embodiments, the first projections 130 and the second projections 140 may have substantially identical shape and size. For example, with reference to the embodiment of FIGS. 3A and 3B, in which the first and second projections 130, 140 are in the form of vanes, the first vanes 130 and the second vanes 140 may be dimensioned such that $T_1$ is substantially equal to $T_2$, $H_1$ is substantially equal to $H_2$, and $W_1$ is substantially equal to $W_2$. In other embodiments, the first and second projections 130, 140 may comprise more than one size and/or shape. In certain embodiments, the first pitch of the first projections 130 may be substantially equal to the second pitch of the second projections 140. With reference to FIG. 3B, for example, both the first vanes 130 and the second vanes 140 may be distributed at period d in a direction of the axis of propagation 120. Accordingly, the pitch of both the first vanes 130 and the second vanes 140 is equal to d.

In certain embodiments, the first pitch and the second pitch may remain constant for all first projections 130 and all second projections 140, respectively. For the sake of example and with reference to FIG. 3B, d may be a constant value of approximately 105 μm for all of the first projections 130 and all of the second projections 140. In other embodiments, the first and second pitches may co-vary uniformly in a direction of the axis of propagation 120. Such variation in the first and second pitches may be used, for example, to compensate for a decrease in the energy of the electron sheet beam as it traverses the SWS 100 in a direction of the axis of propagation 120. In one such embodiment, the pitch variation may occur gradually over a length of the SWS 100, while in another embodiment the pitch variation may be stepped such that contiguous regions of the SWS 100 along the axis of propagation 120 each have constant, but different, first and second pitch values.

Figure 14:
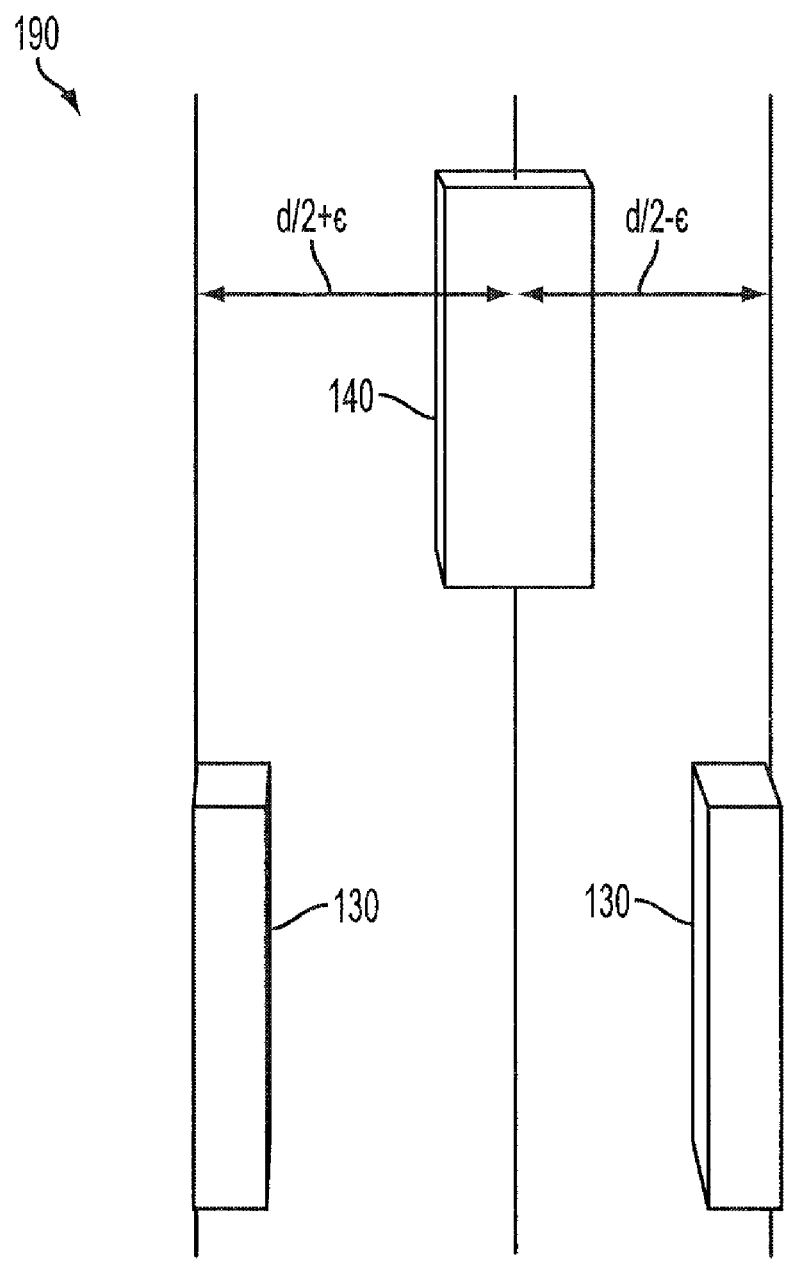
FIG. 14 illustrates one embodiment of an asymmetric staggered cell configuration.

As shown in FIG. 3B, the staggered configuration of second projections 140 located on the interior surface 145 of the second wall 115 may be such that a second projection 140 symmetrically opposes a pair of adjacent first projections 130 located on the interior surface 135 of the first wall 110. Accordingly, in embodiments in which the first pitch and the second pitch are equal, a number of the second projections 140 will be effectively shifted along the axis of propagation 120 by a distance equal to one-half of the pitch value to effect the staggered configuration. In other embodiments shown in FIG. 14, the staggered configuration of second projections 140 on the interior surface 145 of the second wall 115 may be such that each second projection 140 of the staggered configuration asymmetrically opposes each of a pair of adjacent first projections 130 located on the interior surface 135 of the first wall 110. As shown in FIG. 14, cell configuration 190 has first and second projections 130, 140 that are asymmetrically staggered by a first offset that is equal to half the pitch plus some value $\in$ (shown as d/2+$\in$) and a second offset that is equal to half the pitch minus the value $\in$ (shown as d/2−$\in$).

Figure 4:
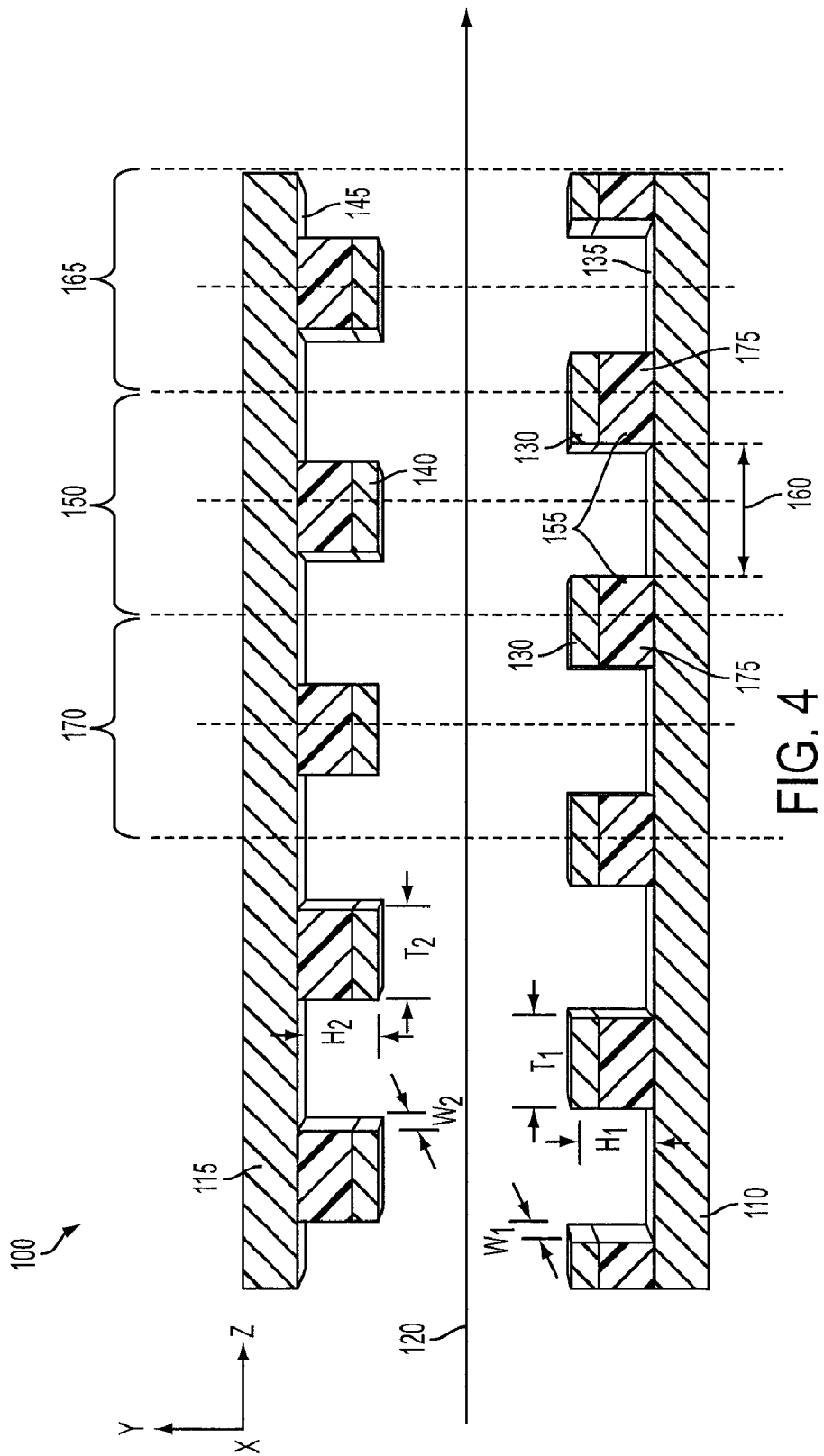
FIG. 4 illustrates a cell structure of the circuit of FIG. 3A according to one embodiment.

By virtue of the alternating arrangement of a number of the second projections 140 relative to a number of corresponding first projections 130 along the axis of propagation 120, it will be appreciated that embodiments of the SWS 100 may be considered as an assemblage of adjacent cells distributed over a length of the wave guide 105 in a direction of the axis of propagation 120. FIG. 4 illustrates a first cell 150 according to one embodiment, shown along axes X, Y, and Z. The first cell 150 of the SWS 100 may comprise adjacent first portions 155 of a pair of first projections 130, with the first projections 130 of the pair being adjacently located on the interior surface 135 of the first wall 110, and having a height $H_1$, a width $W_1$, and a thickness $T_1$. The pair of first projections 130 may be normal to the interior surface 135 of the first wall 110 and axially spaced along the axis of propagation 120 to define a gap 160. The first cell 150 may further comprise a second projection 140 located on the interior surface 145 of the second wall 115, and having a height $H_2$, a width $W_2$, and a thickness $T_2$. The second projection 140 may be normal to the interior surface 145 of the second wall 115 and is axially positioned along the propagation axis 120 such that the second projection 140 is centrally located on a portion of the interior surface 145 of the second wall 115 that is opposite the gap 160. Cells adjacent to the first cell 150 may comprise portion of the pair of first projections 130. For example, as shown in FIG. 4, second and third cells 165, 170 adjacent to the first cell 150 may respectively comprise second portions 175 of the pair of first projections 130.

Figure 7:
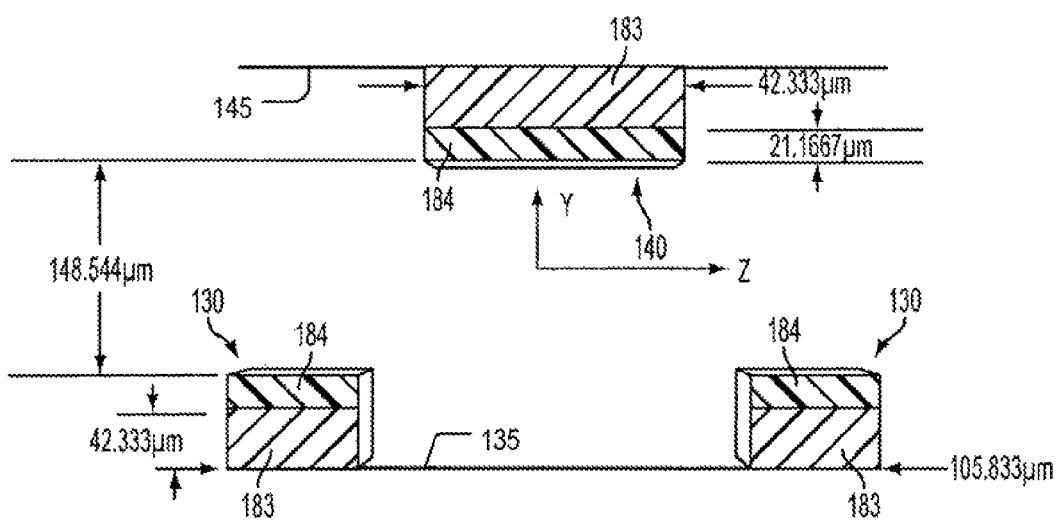
FIG. 7 illustrates a cell configuration of an SWS according to one embodiment.

According to various embodiments, at least one of the first projections 130 and the second projections 140 may comprise a dielectric material and/or a metallic (e.g., an electrically conducting) material. In the embodiment shown in FIGS. 3B and 4, a first portion of each of the first and second projections 130, 140 that is adjacent to their respective interior surfaces 135, 145 may comprise a dielectric material, and a second portion of the first and second projections 130, 140 distally located with respect to their respective interior surfaces 135, 145 may comprise a metallic material. In another embodiment, shown in FIG. 7, the first portion of first and second projections 130, 140 comprise a metallic material and the second portion of first and second projections 130, 140 comprise a dielectric material. In other embodiments, each of the first and second projections 130, 140 may be constructed from a metallic material only. Suitable dielectric materials may include, for example, diamond and beryllium oxide, and suitable metallic materials may include, for example, copper, molybdenum, or tungsten. The use of dielectric and/or metal materials to construct the first and second projections 130, 140 may be dictated at least in part by frequencies at which the SWS 100 is intended to operate and heat dissipation considerations. For example, at high frequencies (e.g., hundreds of GHz), the RF ohmic losses on metallic surfaces of the SWS 100 may be significant. Accordingly, embodiments of the SWS 100 intended for operation at high frequencies may comprise first and second projections 130, 140 constructed of a combination of suitable dielectric and metal materials as shown in FIGS. 3B, 4 and 7. The particular dielectric material used in such embodiments may be selected based on its ability to withstand the heat generated by virtue of the interaction of the dielectric material with high frequency electrical fields. In embodiments in which ohmic losses may be tolerated, the first and second projections 130, 140 may be constructed from metallic material only In certain embodiments, the SWS 100 may comprise one or more first and second projections 130, 140 constructed of a combination of dielectric and metallic materials, as well as one or more first and second projections 130, 140 constructed from a metallic material only.

According to various embodiments, the SWS 100 may be constructed using microfabrication techniques suitable for forming the SWS feature sizes and geometries with the necessary accuracy and smoothness. Such techniques may include, for example, deep reactive ion etching (DRIE) techniques, Lithography, Electroplating, and Molding (LIGA) techniques, electrical discharge machining (EDM) techniques, and micro electrical mechanical system (MEMS) techniques.

Figure 5:
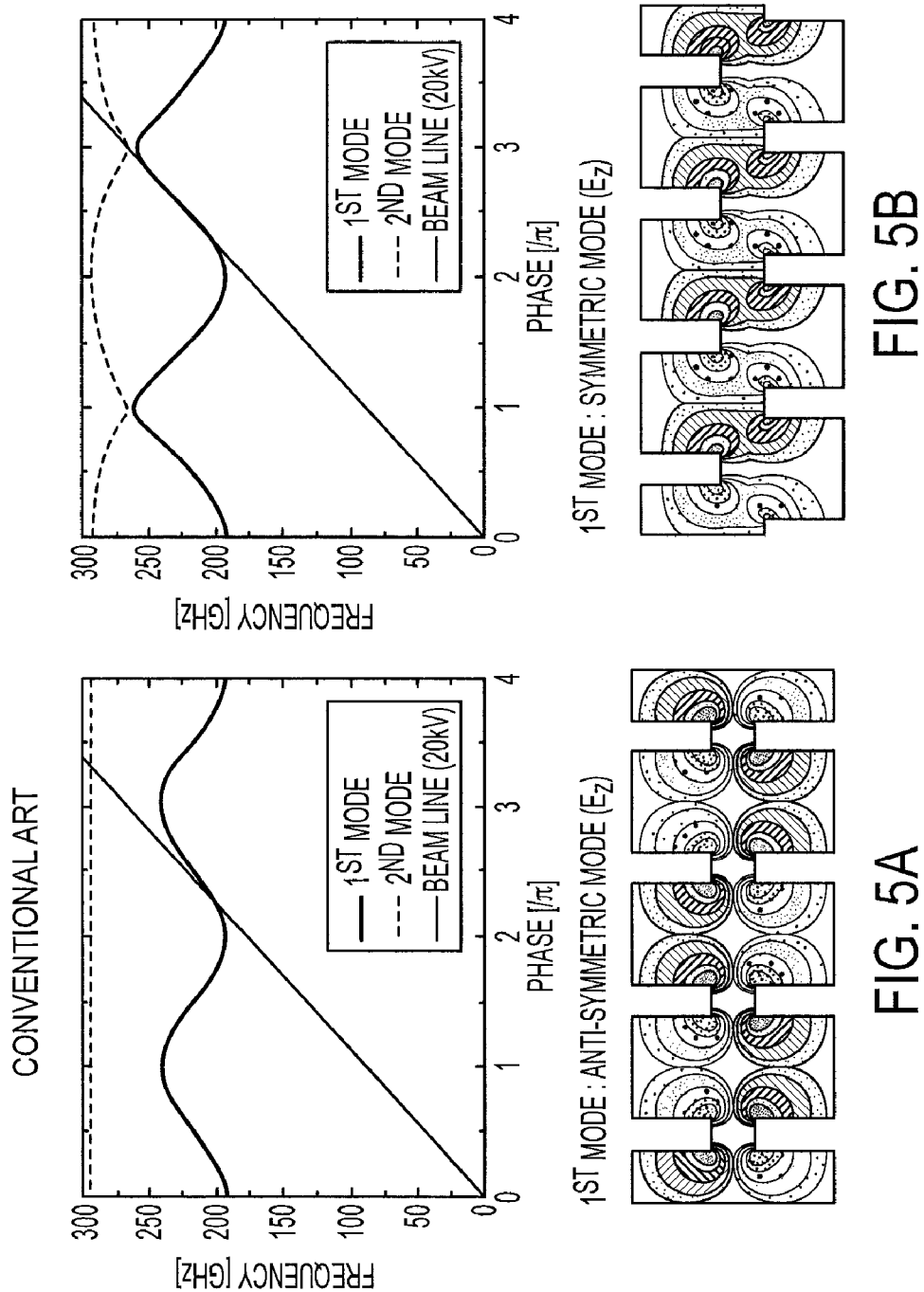
FIGS. 5A and 5B illustrate a comparison between a conventional art aligned vane SWS, shown in FIG. 5A, and a configuration of the SWS of FIG. 3A according to one embodiment, shown in FIG. 5B.

FIGS. 5A and 5B illustrate a comparison between a conventional aligned vane SWS (e.g., the Smith-Purcell structure of FIG. 1) and an SWS employing the staggered configuration of FIG. 3A. FIGS. 5A and 5B show the Frequency (in GHz) of the input frequency along the Y axis and the phase along the X axis (the phase input is shown in units of 1/, as the phase parameter is typically chosen as a multiple of pi). For purposes of clarity, the mode in the 180 to 260 GHz range is defined to be the "first mode," or "fundamental mode," and the mode in the 260 to 300 GHz range to be the "second mode." The electron beam line is shown as a 20 kV electron beam. Additionally, the region from 0 to $2\pi$ (shown is the area from 0 to 2 on the graph) is defined to be the "fundamental spatial harmonic" or "n=0 spatial harmonic" and the region from $2\pi$ to $4\pi$. (shown in the area from 2 to 4 on the graph) is defined to be the "first spatial harmonic" or "n=1 spatial harmonic." As shown in FIG. 5A, the fundamental (first) mode for an aligned vane SWS (e.g., the Smith-Purcell structure 5 of FIG. 1) has an anti-symmetric electric field $E_z$ in the transverse direction. The resulting longitudinal field in the electron beam tunnel averages to zero, resulting in little or no net energy transfer from the electron sheet beam to the RF wave. The RF wave thus decays rather than undergoing the desired power amplification. In contrast, as shown in FIG. 5B, the first mode of an SWS employing the staggered configuration of FIG. 3A has a symmetric electric field distribution $E_z$ which has sinusoidal phase variation in the axial direction. The input RF wave can thus be properly amplified under fundamental mode operation.

Figure 6:
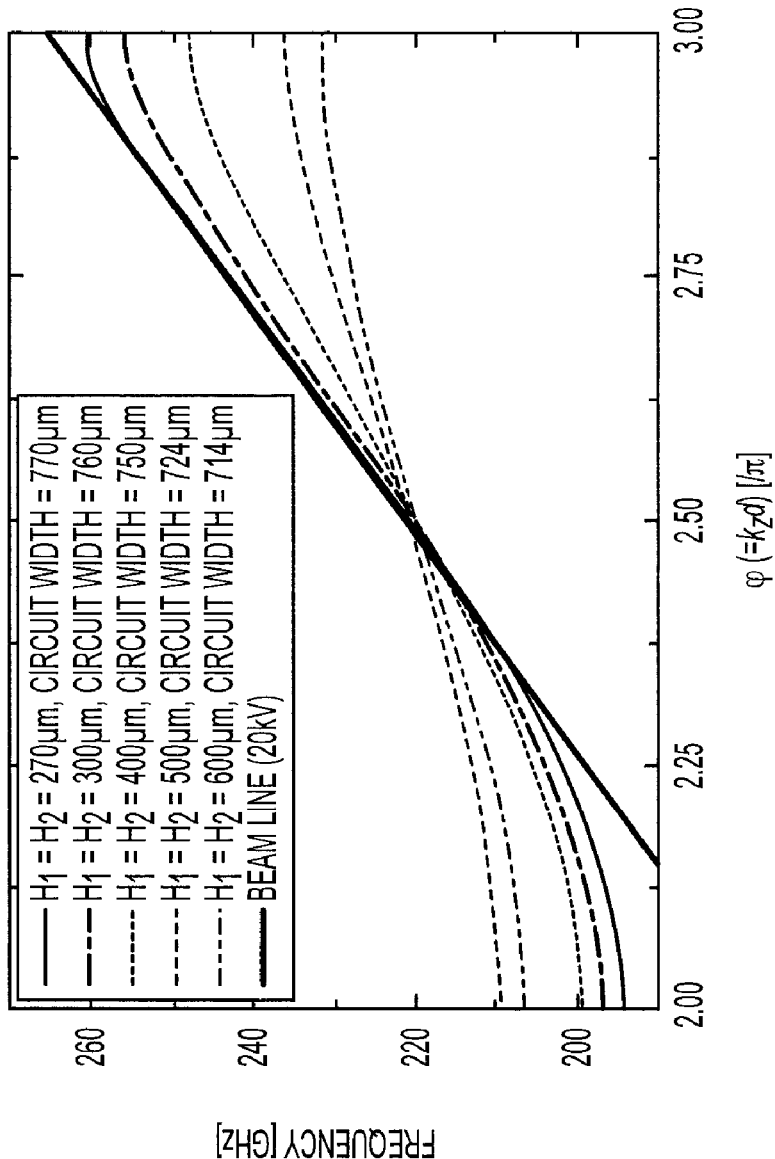
FIG. 6 illustrates a dependence of circuit dispersion on vane height and circuit width according to one embodiment.

According to various embodiments, dimensions of the SWS 100 may be determined in according with the broad spectrum synchronous condition. By way of example, and not limitation, at a center frequency $f_0$ of 220 GHz, the phase can be selected as a design parameter of $\phi(=k_z d)=2.5a$, where $\phi$ is the phase, $k_z$ is the axial wave number, and d is the period. $\phi$ may be defined for phase synchronism with a 20 kV electron sheet beam. Dimensions of the SWS 100 may be designed to provide a circuit phase velocity which is the same as the space charge (beam) phase velocity over a particular frequency band. The pitch, or period, for the first and second projections may be derived from:

$$\phi = kzd = (2\pi f_0/v_e)d, \quad (1)$$

$$\text{where } f_0 = 220 \text{ GHz}, \quad (2)$$

$$v_e = (2\eta V_0)^{1/2} = 0.27c, \quad (3)$$

$$V_0 = 20 \text{ kV, and} \quad (4)$$

$$\phi = 2.5\pi, \quad (5)$$

where $f_0$ is the center frequency (or fundamental frequency), $v_e$ is the phase velocity (or electron beam velocity), $\eta$ is the wave impedance, and $V_0$ is the voltage of the electron sheet beam, which yields a pitch value of approximately 460 μm. The thickness of the first and second vanes 130, 140 ($T_1$, $T_2$) may be one fourth of the pitch value, or 115 μm. Additionally, because the output efficiency and bandwidth of the SWS 100 depend on the vane heights, $H_1$, $H_2$, as well as the width of the SWS 100 circuit, simulations may be conducted to determine the dependence of circuit dispersion on these parameters. FIG. 6 illustrates cold dispersion curves of the fundamental mode for various combinations of vane height and circuit width at the first spatial harmonic regime (n=1) while maintaining 220 GHz operation and $2.5\pi$ synchronism. FIG. 6 shows the phase $\phi=k_z d$ (in units of $1/\pi$) along the x-axis and the frequency (in GHz) along the y-axis. The electron beam input is the same beam line (20 kV) as shown in FIGS. 5A and 5B. As shown in FIG. 6, circuit dispersion increases with increasing vane height, with H1 being the height of first vane 130 and H2 being the height of second vane 140, and decreasing circuit width (where circuit width is the sum of each cell width (see FIG. 7)). The following beam tunnel dimensions are shown: a vane height of 270 μm and a circuit width of 770 μm, a vane height of 300 μm and a circuit width of 760 μm, a vane height of 400 μm and a circuit width of 750 μm, a vane height of 500 μm and a circuit width of 724 μm, and a vane height of 600 μm and a circuit width of 714 μm. Suitable design values of vane height and circuit width in accordance with the present example are 270 μm and 770 μm respectively, which provide wide matching with the beam line. Beam tunnel dimensions of 150 μm (y)×770 μm (x) correspond to a beam filling factor of 61% for a sheet beam size of 100 μm (y)×700 μm (x). It should be noted that the maximum width of the SWS 100 circuit must be less than $c/(2f_{max})$, where $f_{max}$ is the highest frequency in the operation band, in order to prevent excitement of higher order parasitic modes in the structure and the resulting destruction of the electron beam.

Figure 8:
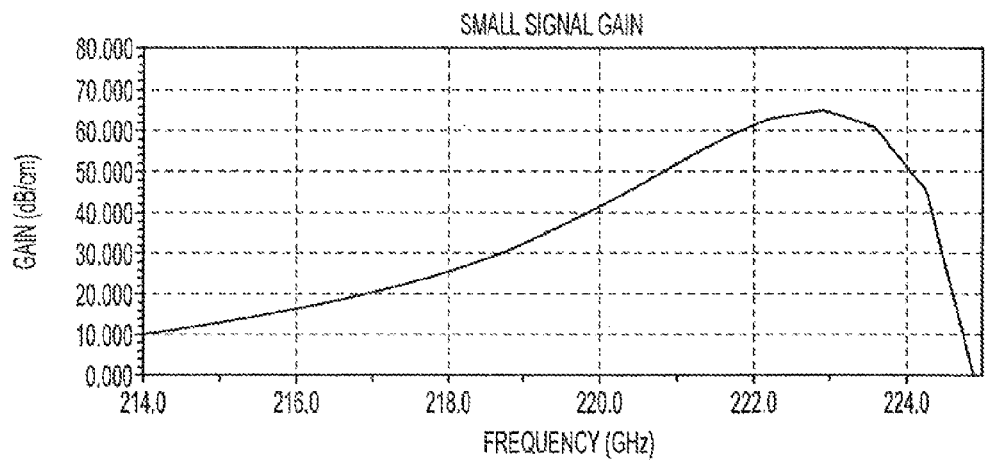
FIGS. 8 and 9 illustrate gain and saturated power characteristics, respectively, of an SWS employing the cell configuration of FIG. 7.
Figure 9:
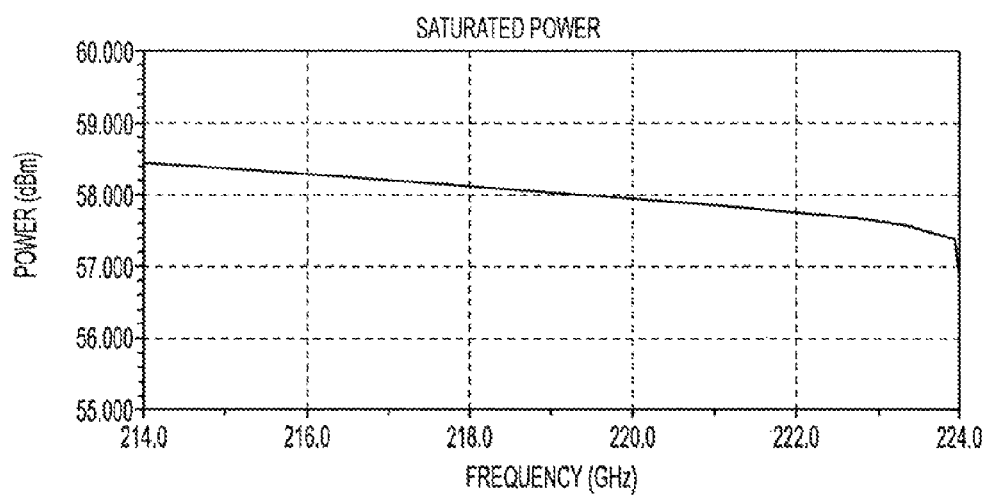

As previously discussed, RF ohmic losses on metallic surfaces of an SWS may be significant at high frequencies. It is therefore necessary for an SWS operating at such frequencies to have a suitably high gain per unit length to overcome such losses. FIG. 7 illustrates by way of example, and not limitation, a cell configuration 180 which is an embodiment of the SWS 100 shown along axes Y and Z (which correspond to axes Y and Z of FIG. 4). The cell configuration 180 may be used in an embodiment of the SWS 100 to provide suitably high gain in a frequency range of 217 to 224 GHz. The first and second projections 130, 140 of cell configuration 180 each have a pitch [[d]] of approximately 160 μm, a thickness ($T_1$, $T_2$) of approximately 42 μm (shown as 42.333 μm), and widths ($W_1$, $W_2$) of approximately 550 μm (note that only half of the second projections 140 are shown). In the embodiment shown in FIG. 7a first portion 183 of each of the first and second projections 130, 140 that is adjacent to their respective interior surfaces 135, 145 may comprise a metal material having a thickness of about 43 μm, and a second portion 184 of the first and second projections 130, 140 distally located with respect to their respective interior surfaces 135, 145 may comprise a dielectric material having a thickness of about 21 μm. The distance (along the Y axis) between the first and second projections 130, 140 may be about 148.5 μm (shown as 148.544 μm) and a distance (along the Z axis) between the beginning of one first projection and the end of one second projection of about 106 μm (shown as 105.833 μm). FIGS. 8 and 9 illustrate gain and saturated power characteristics, respectively, of an SWS 100 employing the cell configuration 180 of FIG. 7. An SWS 100 employing the cell configuration of 180 may be configured as a compact narrowband high power and high gain microwave amplifier having, for example, a 7 GHz bandwidth (217 GHz-224 GHz), an interaction length of approximately 1.5 centimeters, a gain of approximately 30 dB, and a saturated power exceeding 100 W (shown in dBm in FIG. 9). FIG. 8 shows the small signal gain over the bandwidth (e.g., 217 GHz-224 GHz) of the SWS 100 employing the cell configuration 180 of FIG. 7. The operational frequency, in GHz, is shown along the x-axis and the gain, in dB/cm, is shown along the y-axis. As can be seen, the gain of the SWS 100 increases exponentially from about 217 GHz until it begins to drop off at about 223 GHz, with the drop-off becoming more pronounced after 224 GHz. FIG. 9 shows the saturated power of the SWS 100 employing the cell configuration 180 of FIG. 7. The power, shown along the y-axis in dBm, is given in relation to the frequency, shown in GHz along the x-axis. As can be seen from FIG. 9, the saturated power averages about 58 dBm, which exceeds 100 W, from 217 GHz to about 224 GHz, with a sharp drop-off as the frequency approaches 224 GHz.

Figure 10:
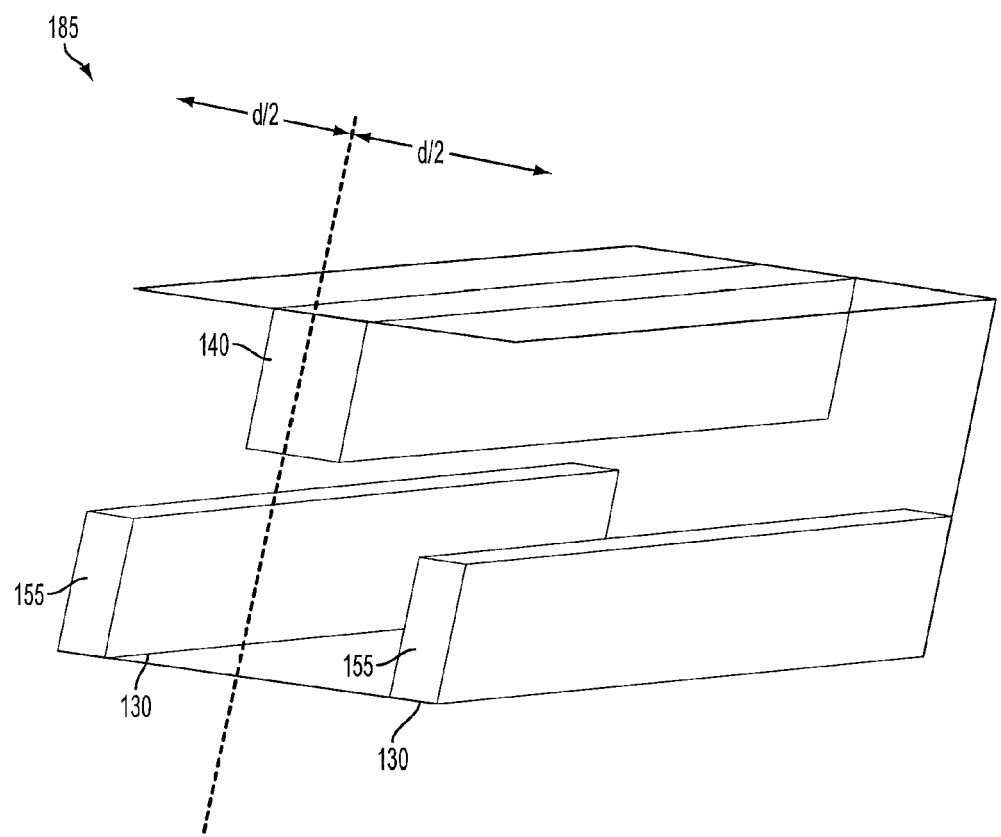
FIG. 10 illustrates a cell configuration of an SWS according to one embodiment.
Figure 11:
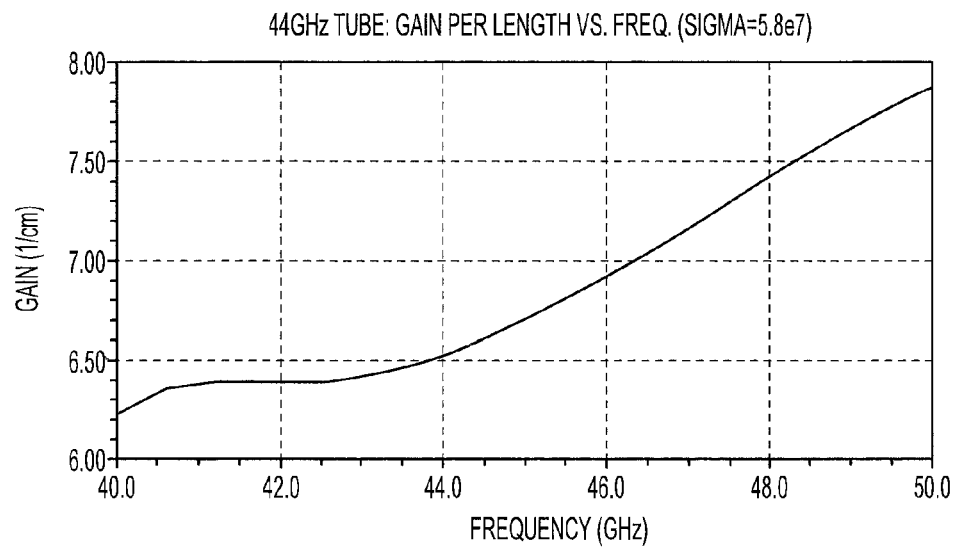
FIGS. 11 and 12 illustrate gain and saturated power characteristics, respectively, of an SWS employing the cell configuration of FIG. 10.
Figure 12:
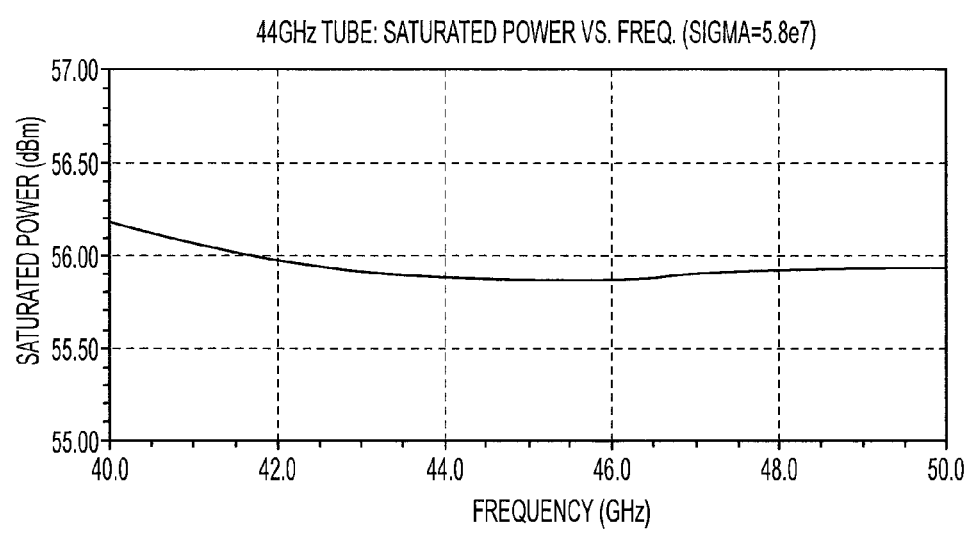

Embodiments of the SWS 100 may also be configured to implement a wide band millimeter wave (e.g., 22%) amplifier. In one such embodiment, for example, the SWS 100 may comprise the cell configuration 185 shown in FIG. 10 in which the vanes 130, 140 comprise only adjacent first portions 155 and are constructed of a metal material only. FIG. 10 shows the cell configuration in sections equal to half the pitch (d/2). FIGS. 11 and 12 illustrate gain and saturated power characteristics, respectively, of an SWS 100 employing the cell configuration 185 of FIG. 10 that is designed to operate at a frequency of 44 GHz. The SWS of FIGS. 11 and 12 is constructed of copper, which has a conductivity (sigma) of 5.8e7 S/m, shown at the top of each graph. FIG. 11 shows a plot of the frequency (in GHz) along the x-axis and the gain (in gain/centimeters) along the y-axis. It will be apparent that the gain/centimeter of FIG. 11 is significantly lower than gain/centimeter at terahertz frequencies as shown in FIG. 8. The reason for this difference is two fold. First, gain scales with wavelength, and in the terahertz range there are more wavelengths per centimeter than in the millimeter range. Second, in order to extend bandwidth, the SWS 100 employing the cell configuration 185 of FIG. 10 was operated in the first spatial harmonics which further reduces circuit interaction impedance. It will thus be appreciated that an SWS 100 configured as a wide band millimeter wave amplifier will have a greater length than an SWS 100 configured to operate in the terahertz frequency range. This may be an acceptable tradeoff, as ohmic losses are lower for lower frequencies. FIG. 12 shows a plot of the frequency (in GHz) along the x-axis and the saturated power (in dBm) along the y-axis. As shown in FIG. 12, the saturated power of this SWS configuration is between 380 W to 417 W. It will thus be appreciated that an SWS 100 employing the cell configuration 185 of FIG. 10 is a good candidate for a 22% millimeter wave wide bandwidth amplifier. With 7 centimeters of interaction length circuit, a gain of 35 dB and a saturated power of over 200 W is expected.

Figure 13:
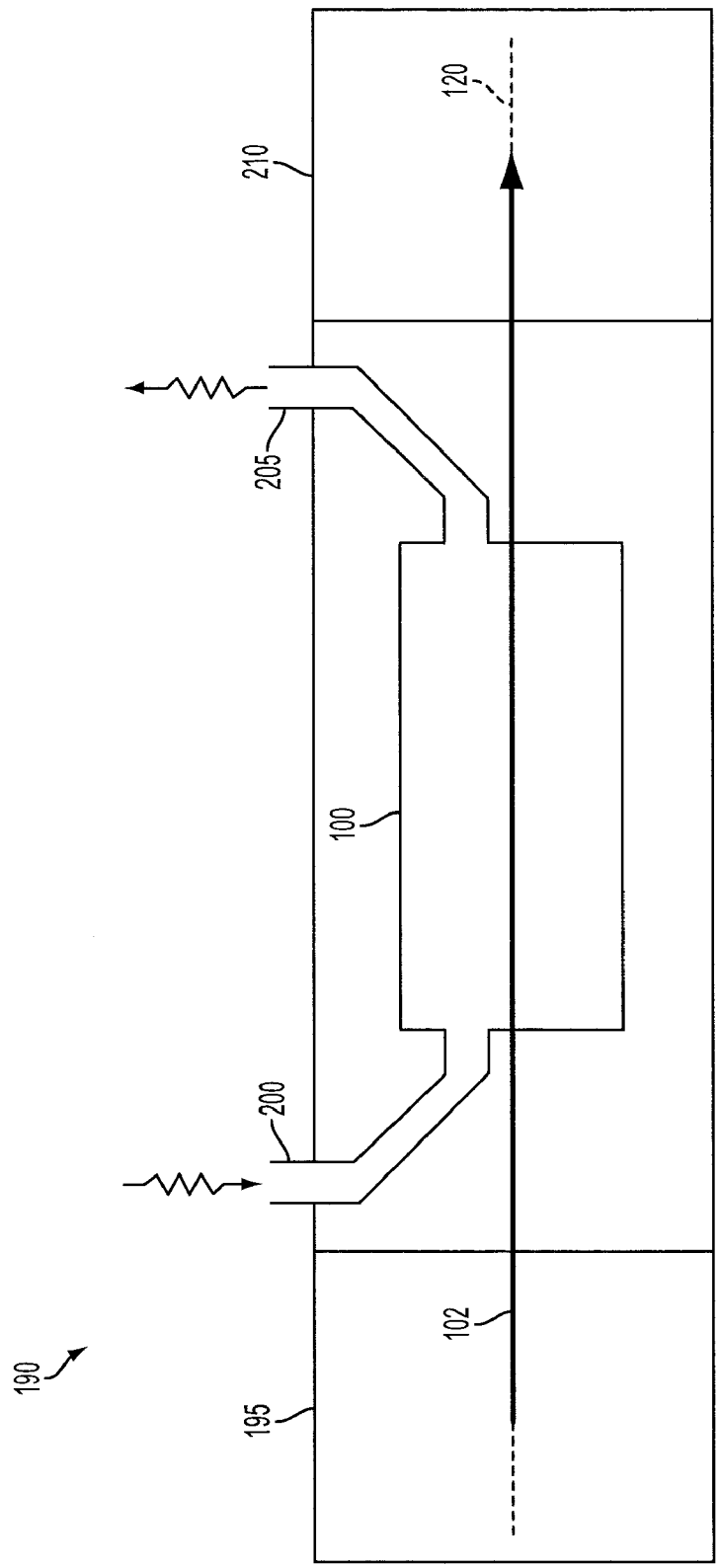
FIG. 13 illustrates a device according to one embodiment.

FIG. 13 illustrates one embodiment of a device 190 comprising the SWS 100. As shown, the device 190 may comprises an electron sheet beam source 195 coupled to the SWS 100 and configured to generate an electron sheet beam 102 propagatable by the SWS 100 along the axis of propagation 120. The electron sheet beam source 195 may comprise an electron sheet beam gun, for example. The electron sheet beam 102 may be communicated to the input of the SWS 100 via one or more electron sheet beam forming, focusing, transporting and/or input coupling devices (not shown). The system 190 may further comprise an input coupling 200 for inputting an RF wave into the SWS 100, an output coupling 205 for extracting the RF wave output from the SWS 100 subsequent to its amplification, and a beam collector 210 to capture the electron sheet beam 102 as it is passed from the SWS 100. Although not shown, the device 190 may further comprise one or more devices (e.g., magnetic devices) to confine and/or otherwise control the electron sheet beam 102 as it passes through the SWS 100.

While various embodiments of the invention have been described herein, it should be apparent, however, that various modifications, alterations and adaptations to those embodiments may occur to persons skilled in the art with the attainment of some or all of the advantages of the present invention. The disclosed embodiments are therefore intended to include all such modifications, alterations and adaptations without departing from the scope and spirit of the present invention as set forth in the appended claims.

What is claimed is:

1. A traveling wave amplifier circuit to receive an RF wave and an electron sheet beam and to effect synchronized interaction therebetween, the circuit comprising:
   a wave guide comprising at least a first wall and a second wall opposite the first wall, wherein the first wall and the second wall are connected to define an axis of propagation and a rectangular wave guide cross-section that is normal to the axis of propagation;
   a plurality of first projections located on and extending from an interior surface of the first wall of the wave guide, wherein the first projections are pitched in a direction of the axis of propagation;
   a plurality of second projections located on and extending from an interior surface of the second wall of the wave guide, wherein the second projections are pitched in the direction of the axis of propagation;
   wherein a number of the second projections are located on and extending from the interior surface of the second wall in a staggered configuration in the direction of the axis of propagation relative to a number of corresponding first projections located on and extending from the interior surface of the first wall; and
   wherein one or more of the first and second projections comprise a composite stack of a dielectric material and a metal material.

2. The traveling wave amplifier circuit of claim 1,
   wherein each of the first projections comprises a first vane normal to the interior surface of the first wall, the first vane defining: a substantially constant thickness T1 measured in the direction of the axis of propagation, a substantially constant height H1 measured in the direction normal to the interior surface of the first wall, and a substantially constant width W1 measure in a direction transverse to the axis of propagation; and
   wherein each of the second projections comprises a second vane normal to the interior surface of the second wall, the second vane defining: a substantially constant thickness T2 measured in the direction of the axis of propagation, a substantially constant height H2 measured in a direction normal to the interior surface of the second wall, and a substantially constant width W2 measured in a direction transverse to the axis of propagation.

3. The traveling wave amplifier circuit of claim 2, wherein W1 is substantially equal to a width of the interior surface of the first wall measured in the direction transverse to the axis of propagation.

4. The traveling wave amplifier circuit of claim 2, wherein W2 is substantially equal to a width of the interior surface of the second wall measured in the direction transverse to the axis of propagation.

5. The traveling wave amplifier circuit of claim 2, wherein T1 is substantially equal to T2, wherein H1 is substantially equal to H2, and wherein W1 is substantially equal to W2.

6. The traveling wave amplifier circuit of claim 1, wherein the pitch of the second projections is substantially equal to the pitch of the first projections.

7. The traveling wave amplifier circuit of claim 6, wherein the pitch of the first projections and the pitch of the second projections is a constant value.

8. The traveling wave amplifier circuit of claim 6, wherein a change in the pitch of the first projections is equal to a change in the pitch of the second projections.

9. The traveling wave amplifier circuit of claim 1, wherein each second projection of the staggered configuration symmetrically opposes a pair of adjacent first projections located on the interior surface of the first wall.

10. The traveling wave amplifier of claim 1, wherein each second projection of the staggered configuration asymmetrically opposes each of a pair of adjacent first projections located on the interior surface of the first wall.

11. The traveling wave amplifier circuit of claim 1, wherein the dielectric material is selected from the group consisting of: diamond, beryllium oxide.

12. The traveling wave amplifier circuit of claim 1, wherein the metal material is selected from the group consisting of: copper, molybdenum, tungsten.

13. A traveling wave amplifier circuit to receive an RF wave and an electron sheet beam to effect synchronized interaction therebetween, the circuit comprising:
- a wave guide comprising at least a first wall and a second wall opposite the first wall, wherein the first wall and the second wall are connected to define an axis of propagation and a rectangular wave guide cross-section that is normal to the axis of propagation;
- a plurality of first projections located on and extending from an interior surface of the first wall of the wave guide, wherein the first projections are pitched in a direction of the axis of propagation;
- a plurality of second projections located on an interior surface of the second wall of the wave guide, wherein the second projections are pitched in the direction of the axis of propagation;
- wherein a number of the second projections are located on and extending from the interior surface of the second wall in a staggered configuration in the direction of the axis of propagation relative to a number of corresponding first projections located on the interior surface of the first wall; and
- wherein each second projection of the staggered configuration asymmetrically opposes each of a pair of adjacent first projections located on the interior surface of the first wall.

14. The traveling wave amplifier circuit of claim 13, wherein each of the first projections comprises a first vane normal to the interior surface of the first wall, the first vane defining: a substantially constant thickness T1 measured in the direction of the axis of propagation, a substantially constant height H1 measured in the direction normal to the interior surface of the first wall, and a substantially constant width W1 measure in a direction transverse to the axis of propagation; and
wherein each of the second projections comprises a second vane normal to the interior surface of the second wall, the second vane defining: a substantially constant thickness T2 measured in the direction of the axis of propagation, a substantially constant height H2 measured in a direction normal to the interior surface of the second wall, and a substantially constant width W2 measured in a direction transverse to the axis of propagation.

15. The traveling wave amplifier circuit of claim 14, wherein T1 is substantially equal to T2, wherein H1 is substantially equal to H2, and wherein W1 is substantially equal to W2.

16. The traveling wave amplifier circuit of claim 14, wherein W2 is substantially equal to a width of the interior surface of the second wall measured in the direction transverse to the axis of propagation.

17. The traveling wave amplifier circuit of claim 14, wherein W1 is substantially equal to a width of the interior surface of the first wall measured in the direction transverse to the axis of propagation.

18. The traveling wave amplifier circuit of claim 13, wherein each one or more of the first and second projections comprise of a composite stack of a metal material and a dielectric material.

19. The traveling wave amplifier circuit of claim 18, wherein the dielectric material is selected from the group consisting of: diamond, beryllium oxide.

20. The traveling wave amplifier circuit of claim 18, wherein the metal material is selected from the group consisting of: copper, molybdenum, tungsten.

21. The traveling wave amplifier circuit of claim 13, wherein the pitch of the second projections is substantially equal to the pitch of the first projections.

22. The traveling wave amplifier circuit of claim 21, wherein the pitch of the first projections and the pitch of the second projections is a constant value.

23. The traveling wave amplifier circuit of claim 21, wherein a change in the pitch of the first projections is equal to a change in the pitch of the second projections.

* * * * *